United States Patent [19]

Ohsawa

[11] 4,024,461
[45] May 17, 1977

[54] FM DISCRIMINATOR

[75] Inventor: Mitsuo Ohsawa, Fujisawa, Japan

[73] Assignee: Sony Corporation, Tokyo, Japan

[22] Filed: Apr. 23, 1976

[21] Appl. No.: 679,862

[30] Foreign Application Priority Data

Apr. 24, 1975 Japan .............................. 50-50047
May 8, 1975 Japan .............................. 50-55735

[52] U.S. Cl. .......................... 329/138; 307/233 R; 325/349
[51] Int. Cl.² ........................................ H03D 3/06
[58] Field of Search ........... 307/233; 329/137, 138; 325/349

[56] References Cited
UNITED STATES PATENTS 3,866,125  2/1975  Kilian ................................. 329/137

OTHER PUBLICATIONS

B565,717, Apr. 1976, Peil et al., 329/138.

Primary Examiner—John Kominski
Attorney, Agent, or Firm—Hill, Gross, Simpson, Van Santen, Steadman, Chiara & Simpson

[57] ABSTRACT

An FM discriminator with AFC signal producing circuits is disclosed having a pair of differential switching circuits which form the discriminator and produce output signals opposite in phase. A first constant current signal source is provided which is connected to the output terminal of one of the switching circuits. A second constant current signal source is connected to the output terminal of the other switching circuit. A biasing circuit is provided for supplying a bias to the first and second constant current signal sources respectively through a resistor. Finally, a circuit is provided for deriving AFC signals opposite in polarity from the first and second constant current signal sources, respectively.

10 Claims, 19 Drawing Figures

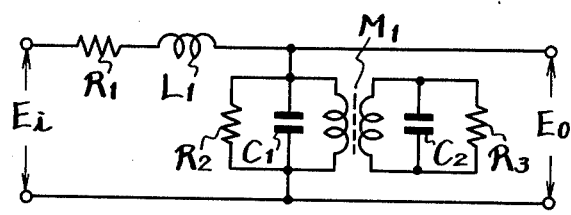
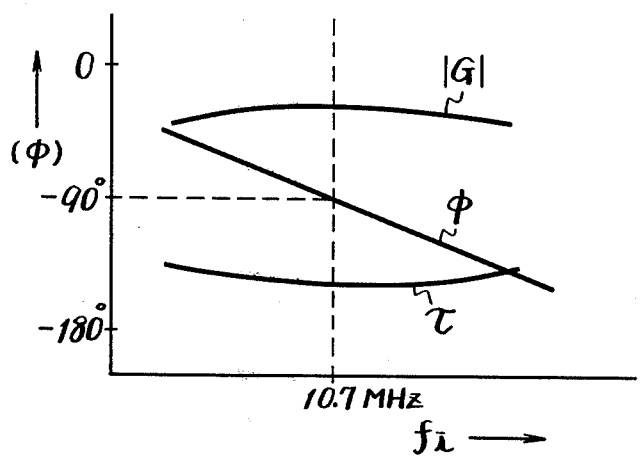
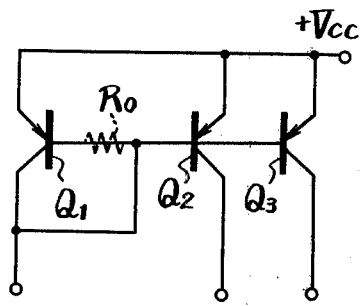
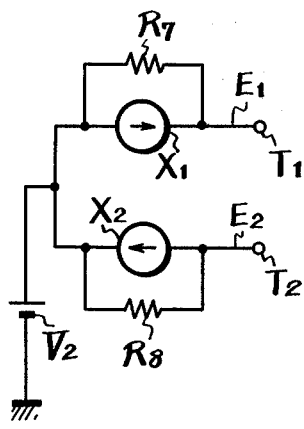
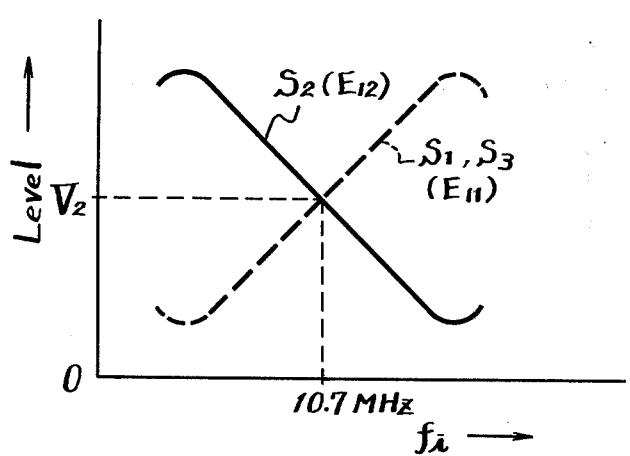

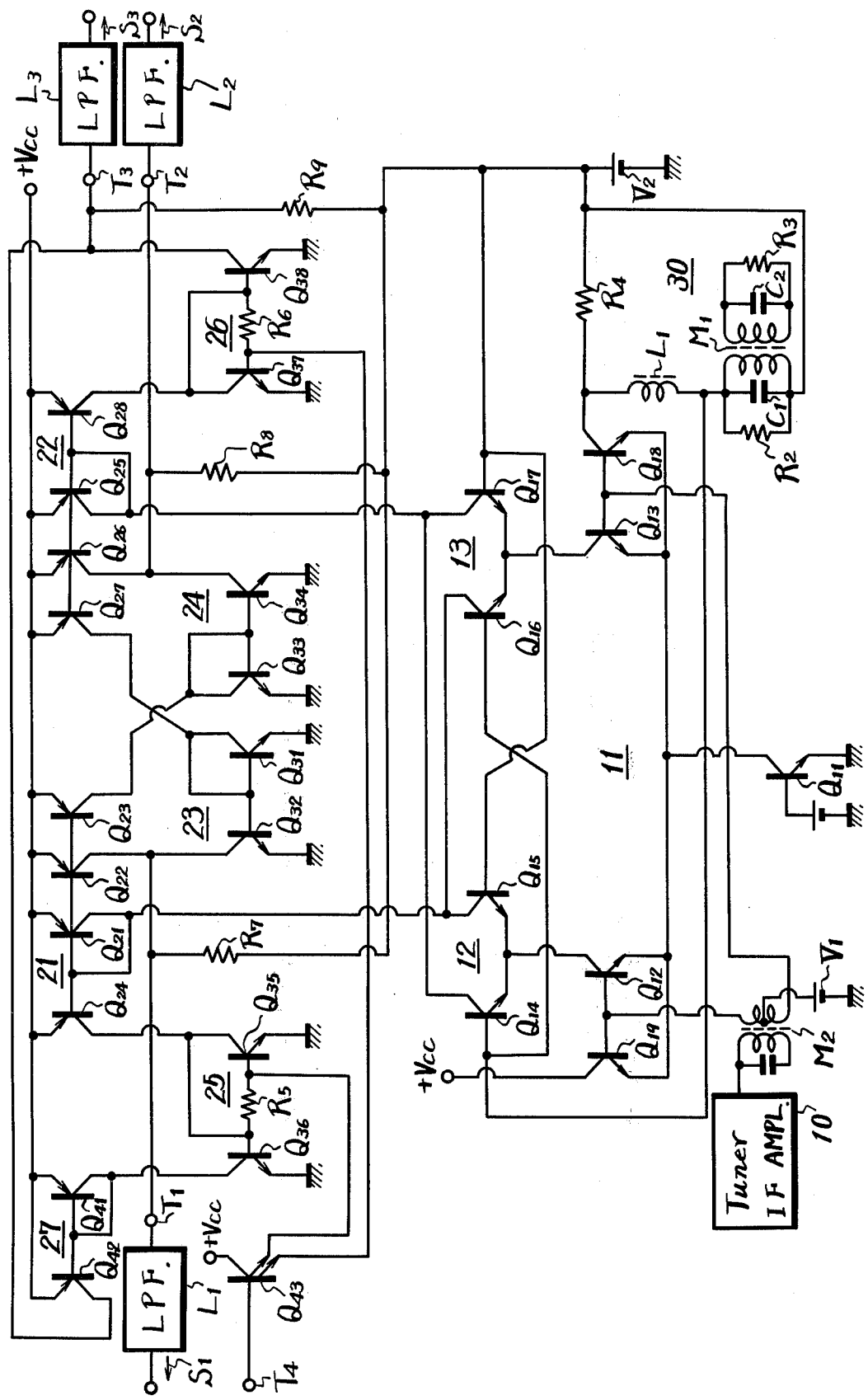

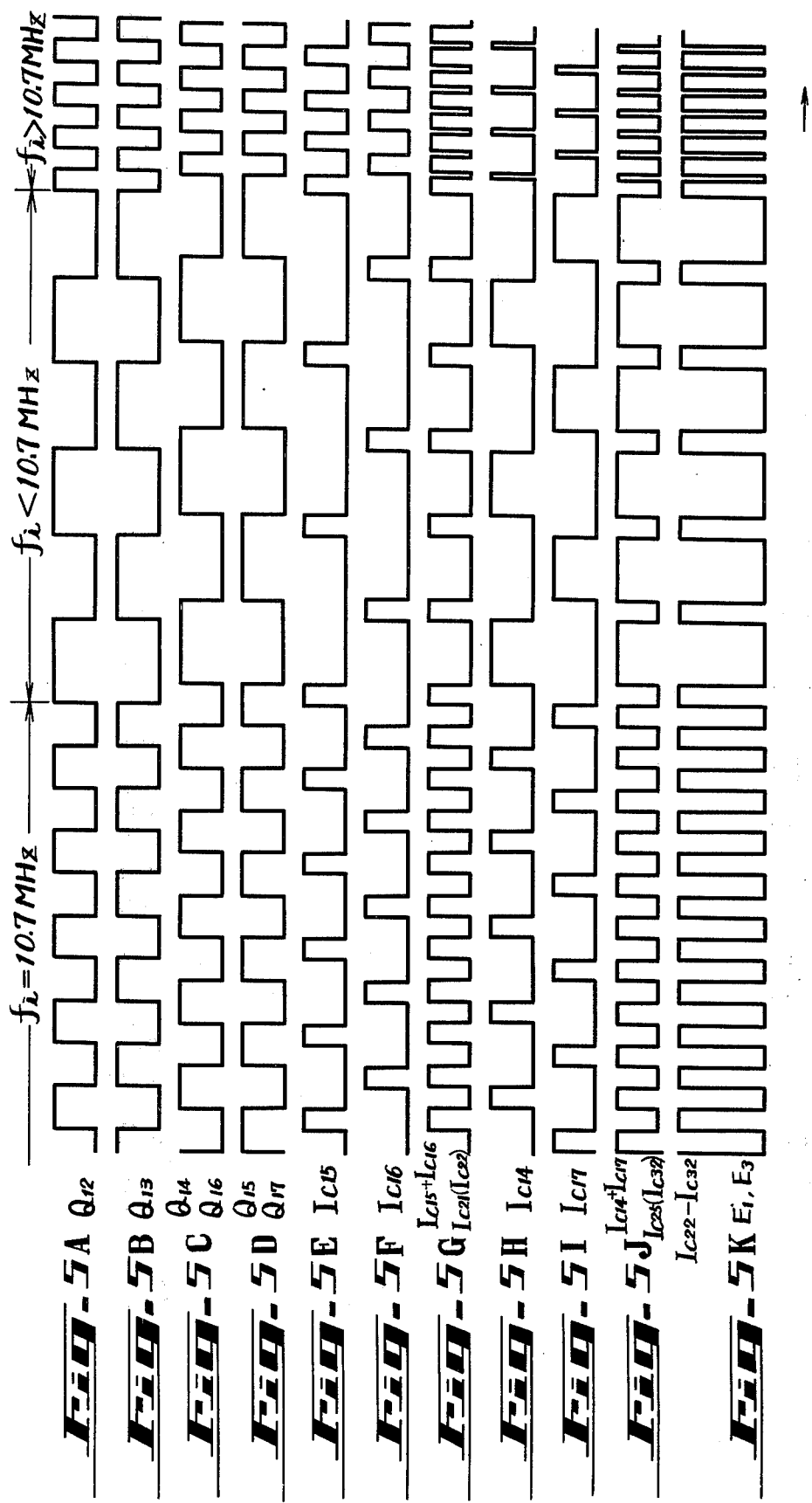

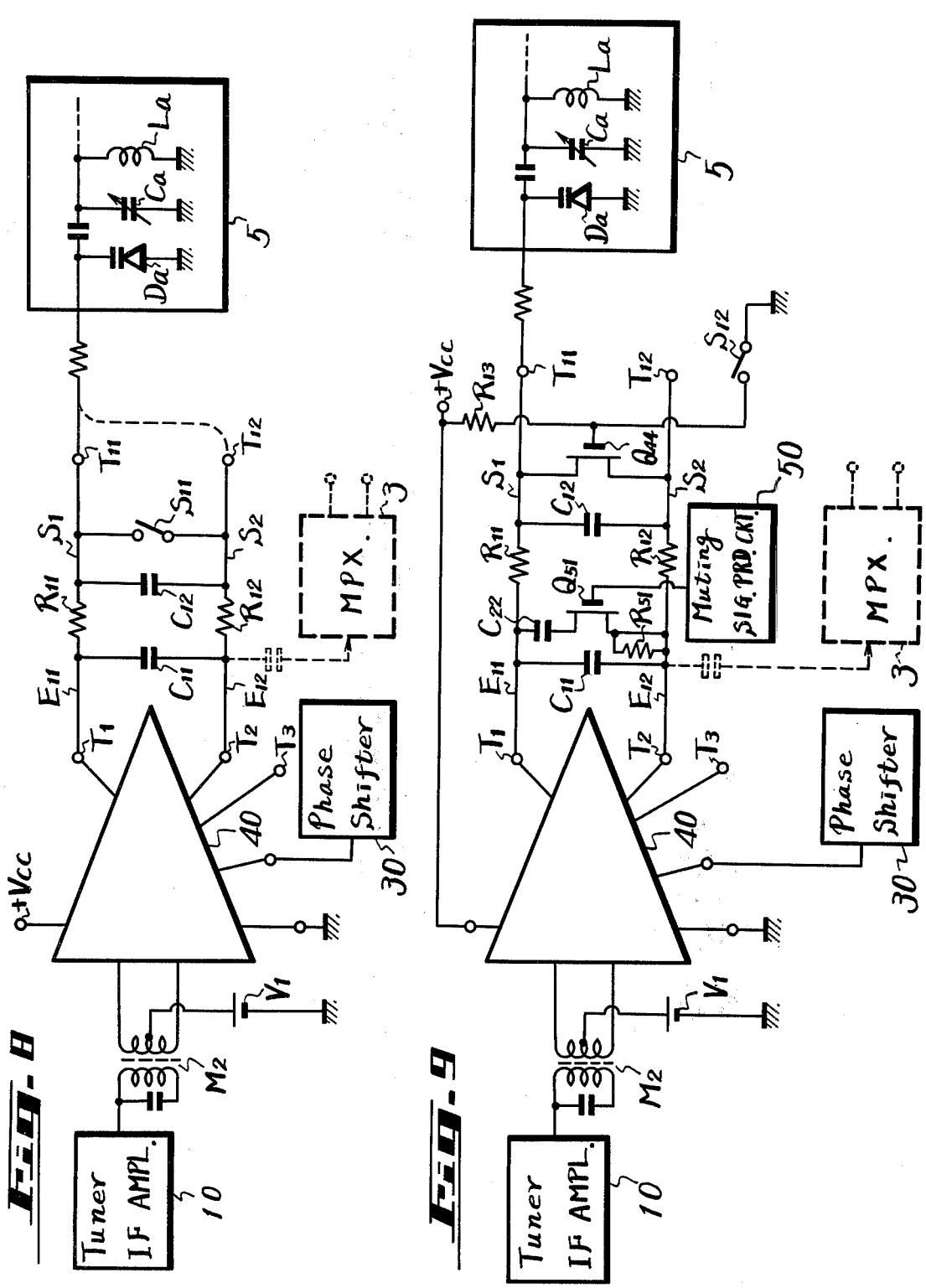

FM DISCRIMINATOR

BACKGROUND OF THE INVENTION

1. Field of the Invention

The present invention relates generally to an FM discriminator and more particularly to an FM discriminator with AFC signal producing circuits which will produce AFC signals opposite in polarity.

2. Description of the Prior Art

In the prior art FM receiver, the output signal from its FM discriminator circuit is supplied to a low pass filter which produces a DC voltage or AFC voltage whose polarity and level varies in accordance with the drift of an intermediate frequency $f_i$. The AFC voltage is then supplied to a variable capacitance diode which is connected in parallel to the variable capacitor and coil of a local oscillator circuit for determining the oscillation frequency of the local oscillator circuit to be automatically compensated.

In this case, however, the AFC voltage is varied in polarity and level in accordance with the intermediate frequency $f_i$ so that, in order to place the variable capacitance diode in a reverse-biased state irrespective of the AFC voltage, it is necessary to employ a constant voltage diode for supplying a reverse bias voltage to the variable capacitance diode.

For example, in Japan an FM receiver employs a system wherein the local oscillation frequency is lower than the received frequency (a lower heterodyne system) while in, for example, the USA, an FM receiver employs a system wherein the local oscillation frequency is higher than the received frequency (an upper heterodyne system). Therefore, with respect to the intermediate frequency $f_i$, it is required that the polarity and level of the AFC voltage of an FM receiver for the USA be reversed from the AFC voltage of an FM receiver for Japan. For this reason, even in the same discriminator circuits, it is necessary that the polarities of a pair of diodes for ratio detecting in the FM receivers for Japan are opposite to those for the USA. This creates an obstacle for mass-production of FM receivers.

In general, since the front end and intermediate frequency amplifier and discriminator circuits are provided on separate printed boards in an FM receiver, it is preferable that the intermediate frequency amplifier and discriminator are the same for both the lower heterodyne and upper heterodyne systems. However, due to the fact that the polarities of a pair of diodes for ratio detection are opposite for the two systems, the intermediate frequency amplifier and discriminator can be made the same. Hence, mass-production is inhibited.

SUMMARY OF THE INVENTION

Accordingly, it is an object of the present invention to provide an FM discriminator which is free from the defects inherent in the prior art.

It is another object of the invention to provide an FM discriminator in which DC voltages opposite in polarity are obtained whereby one of the DC voltages is used as an AFC voltage to omit a constant voltage diode for reverse biasing.

It is a further object of the invention to provide an FM discriminator which can be used for a lower heterodyne system or upper heterodyne system receiver by switching one of AFC voltages to an opposite polarity.

It is a further object of the invention to provide an FM discriminator which is provided with three constant current signal sources connected to the output terminals of differential switching circuits, a biasing circuit supplying a predetermined bias to the constant current signal sources respectively, a circuit deriving two AFC voltages opposite in polarity from two of the three constant current signal souces, a circuit deriving an audio signal from the remaining constant current signal source, and a muting circuit which serves to mute an audio signal, if necessary.

It is still a further object of the invention to provide an FM discriminator which is provided with a circuit for creating two AFC voltages having a constant DC level and a switch to make the circuit operative and inoperative, and in which, when the switch is operated, the tuning of an FM receiver can be smoothly carried out.

It is a further object of the invention to provide an FM discriminator which is suitable to be made as an integrated circuit together with the FM discriminator and AFC signal producing circuits.

The other objects, features and advantages of the present invention will become apparent from the following description taken in conjunction with the accompanying drawings.

BRIEF DESCRIPTION OF THE DRAWINGS

FIG. 1 is a connection diagram showing a phase shifting circuit which is used as a part of the FM discriminator according to the present invention;

FIG. 2 is a graph showing the characteristics of the phase shifting circuit shown in FIG. 1;

FIG. 3 is a connection diagram showing a constant current signal source circuit which is used as a part of the FM discriminator of the invention;

FIG. 4 is a connection diagram showing an example of the FM discriminator of the invention;

FIGS 5A to 5K, inclusive, are waveform diagrams used to explain the operation of the FM discriminator of the invention shown in FIG. 4;

FIG. 6 is a diagram showing the FM discriminator shown in FIG. 4 in an equivalent form;

FIG. 7 is a graph showing an output signal derived from the FM discriminator shown in FIG. 4; and FIGS. 8 and 9 are connection diagrams showing other examples of the FM discriminator of the invention.

DESCRIPTION OF THE PREFERRED EMBODIMENTS

In order to better understand the present invention, a part of the FM disciminator according to the invention will be now described with reference to FIGS. 1, 2, and 3.

FIG. 1 shows a circuit used as a part of the FM discriminator of the invention, which circuit consists of resistors $R_1$, $R_2$, $R_3$, a coil $L_1$, capacitors $C_1$, $C_2$ and a transformer $M_1$ connected as shown in FIG. 1. In this circuit, the frequency characteristics of a gain | G | of an output voltage $E_o$ for an input voltage $E_i$, a phase shift amount $\phi$ and group delay time $\tau$ are shown in FIG. 2. That is, if the resistance value of the resistors $R_1$ and $R_2$ is selected small, the gain | G | becomes substantially constant within a band between ±1MHz of the frequency 10.7MHz. Further, the phase shift amount $\phi$ becomes −90° at the frequency 10.7MHz and is varied substantially in proportion to the frequency, while the group delay time $\tau$ becomes substantially constant. In other words, the circuit shown in FIG. 1 acts as a phase shifting circuit.

FIG. 3 shows a constant current signal source circuit which is known as a current mirror circuit and which consists of transistors $Q_1$, $Q_2$, and $Q_3$. In this circuit, if the characteristics of the transistors $Q_1$ and $Q_2$ are equal, since they are in the same base-biased condition, the collector current of the transistor $Q_2$ becomes the collector current of the transistor $Q_1$. Further, if the characteristics of the transistor $Q_3$ are also the same as those of the transistor $Q_1$, the collector current of the transistor $Q_3$ becomes equal to that of the transistor $Q_1$. In other words, the collector current of the transistor $Q_1$ becomes equal to that of the transistors $Q_2$ and $Q_3$ as the former is reflected on a mirror. If the characteristics of the transistors $Q_1$ to $Q_3$ are made different, or a resistor $R_0$ is connected as shown by a dotted line in FIG. 3, the collector currents of the transistors $Q_1$ to $Q_3$ can be made different. Further, it is possible that an emitter resistor may be connected to the transistors $Q_1$ to $Q_3$ or the collector of the transistor $Q_1$ may be connected to its base through a transistor of an emitter follower configuration instead of the collector of the transistor $Q_1$ being connected directly to its base. In FIG. 3, $+V_{CC}$ designates a voltage applied to the current mirror circuit.

The present invention utilizes the above concepts in providing an FM discriminator.

An example of the FM discriminator according to the invention will be now described with reference to FIG. 4.

In the example shown in FIG. 4, a transistor $Q_{11}$ is used as a constant current signal source for a first differential amplifier 11 which is formed of a pair of transistors $Q_{12}$ and $Q_{13}$. That is, the emitters of the transistors $Q_{12}$ and $Q_{13}$ are connected together to the collector of the transistor $Q_{11}$ whose emitter is grounded and whose base is grounded through a DC voltage source. The bases of the transistors $Q_{12}$ and $Q_{13}$ are supplied with opposite phase intermediate frequency signals with the frequency of 10.7MHz from an output transformer $M_2$ of a tuner and an intermediate frequency signal amplifier circuit 10 and with a bias voltage from a bias voltage source $V_1$. The transistor $Q_{12}$ is taken as a constant current signal source for a second differential amplifier 12 which is formed of transistors $Q_{14}$ and $Q_{15}$. Similarly, a third differential amplifier 13 is formed of transistors $Q_{16}$ and $Q_{17}$ whose constant current signal source is the transistor $Q_{13}$. These differential amplifiers 12 and 13 are connected in parallel such that the paths between their input and output terminals are reverse with respect to each other.

A transistor $Q_{18}$ for buffer action is provided similar to the transistor $Q_{13}$. Thus, the intermediate frequency signal tuned to an intermediate frequency signal from the transformer $M_2$ is supplied through the transistor $Q_{18}$ to a phase shifting circuit 30 which is formed as already described in connection with FIG. 1 and then converted to the intermediate frequency signal whose characteristics are shown in FIG. 2. This converted intermediate frequency signal from the circuit 30 is supplied to the bases of the transistors $Q_{14}$ and $Q_{16}$ of the second and third differential amplifiers 12 and 13, respectively. The transistors $Q_{14}$ and $Q_{17}$ of the differential amplifiers 12 and 13 are supplied with bias voltages from a bias voltage source $V_2$ directly or through a resistor $R_4$ and the phase shifting circuit 30, respectively. In this case, the output impedance of the transistor $Q_{18}$ corresponds to the resistor $R_1$ of the phase shifting circuit shown in FIG. 1, and a transistor $Q_{19}$ is provided so as to balance with the transistor $Q_{18}$.

A first current mirror circuit 21 is formed of transistors $Q_{21}$, $Q_{22}$, $Q_{23}$, and $Q_{24}$. The collector of the transistor $Q_{21}$ is connected to the collectors of the transistors $Q_{15}$ and $Q_{16}$, and the collector of the transistor $Q_{22}$ is connected to a first output terminal $T_1$. A second current mirror circuit 22 is formed of transistors $Q_{25}$, $Q_{26}$, $Q_{27}$, and $Q_{28}$. The collector of the transistor $Q_{25}$ is connected to the collectors of the transistors $Q_{14}$ and $Q_{17}$, respectively, and the collector of the transistor $Q_{26}$ is connected to a second output terminal $T_2$. A third current mirror circuit 23 is formed of transistors $Q_{31}$ and $Q_{32}$. The collector of the transistor $Q_{31}$ is connected to the collector of the transistor $Q_{27}$, and the collector of the transistor $Q_{32}$ is connected to the first output terminal $T_1$. The emitters of the transistors $Q_{31}$ and $Q_{32}$ are grounded. A fourth current mirror circuit 24 is formed of transistors $Q_{33}$ and $Q_{34}$. The collector of the transistor $Q_{33}$ is connected to the collector of the transistor $Q_{23}$, and the collector of the transistor $Q_{34}$ is connected to the second output terminal $T_2$. The emitters of the transistors $Q_{33}$ and $Q_{34}$ are grounded. Resistors $R_7$ and $R_8$ whose resistance value is selected equal, are connected between the terminal $T_1$ and the bias voltage source $V_2$ and between the terminal $T_2$ and the bias voltage source $V_2$, respectively.

Further, a fifth current mirror circuit 25 is formed of transistors $Q_{35}$, $Q_{36}$ and a resistor $R_5$. The collector of the transistor $Q_{35}$ is connected to the collector of the transistor $Q_{24}$. The emitters of the transistors $Q_{35}$ and $Q_{36}$ are grounded. A sixth current mirror circuit 26 is formed of transistors $Q_{37}$, $Q_{38}$ and a resistor $R_6$. The collector of the transistor $Q_{37}$ is connected to the collector of the transistor $Q_{28}$, and the collector of the transistor $Q_{38}$ is connected to a third output terminal $T_3$. The emitters of the transistors $Q_{37}$ and $Q_{38}$ are grounded. Transistors $Q_{41}$ and $Q_{42}$ form a seventh current mirror circuit 27. The collector of the transistor $Q_{41}$ is connected to the collector of the transistor $Q_{36}$, while the collector of the other transistor $Q_{42}$ is connected to the output terminal $T_3$. A resistor $R_9$ is inserted between the terminal $T_3$ and the bias voltage source $V_2$. The emitters of the transistors $Q_{21}$ to $Q_{28}$ and $Q_{41}$, $Q_{42}$ are supplied with a voltage of $+V_{CC}$. A transistor $Q_{43}$ is also used whose collector is supplied with a voltage of $+V_{CC}$, a base which is coupled to an input terminal $T_4$ supplied with a muting signal, and whose first and second emitters are connected to the bases of the transistors $Q_{35}$ and $Q_{37}$, respectively.

With the circuit constructed as above, the intermediate frequency signals from the transformer $M_2$ are supplied to the bases of the transistors $Q_{12}$ and $Q_{13}$ in opposite phase, so that the transistors $Q_{12}$ and $Q_{13}$ are made ON and OFF in reverse phase as shown in FIGS. 5A and 5B, respectively. At this time, the transistor $Q_{18}$ is made ON and OFF in the same phase with the transistor $Q_{13}$. The output signal from the transistor $Q_{18}$ is delayed by the phase shifting circuit 30 with the phase characteristics $\phi$ shown in FIG. 2 and then supplied to the transistors $Q_{14}$ and $Q_{16}$ of the differential amplifiers 12 and 13, respectively. Accordingly, the ON and OFF states of the transistors $Q_{14}$, $Q_{16}$ and $Q_{15}$, $Q_{17}$ are delayed by 90° from the ON and OFF states of the transistors $Q_{12}$, $Q_{13}$ as shown in FIGS. 5C and 5D when the intermediate frequency $f_i$ is the center frequency 10.7MHz, but when the frequency $f_i$ is lower than the center frequency 10.7MHz, the delay is smaller than 90°. However, when the frequency $f_i$ is higher than the center frequency 10.7MHz, the delay is greater than 90°.

Since the collector current $I_{C15}$ of the transistor $Q_{15}$ flows when the transistors $Q_{12}$ and $Q_{15}$ are ON, the collector current $I_{C15}$ becomes as shown in FIG. 5E, while the collector current $I_{C16}$ of the transistor $Q_{16}$ flows when the transistors $Q_{13}$ and $Q_{16}$ are ON, so that the collector current $I_{C16}$ becomes as shown in FIG. 5F. Therefore, the sum current of the collector currents $I_{C15}$ and $I_{C16}$ (or the collector current $I_{C21}$ of the transistor $Q_{21}$) becomes an alternating current signal whose frequency is two times the intermediate frequency $f_i$ and whose duty ratio is 50% when the frequency $f_i$ is the center frequency 10.7MHz but is varied in proportion to a deviated amount when the frequency $f_i$ is deviated from the center frequency 10.7MHz.

Similarly, the collector currents $I_{C14}$, $I_{C17}$ of the transistors $Q_{14}$, $Q_{17}$ and their sum current (the collector current $I_{C25}$ of the transistor $Q_{25}$) become as shown in FIGS. 5H, 5I and 5J, respectively. In other words, the sum current of the collector currents $I_{C15}$ and $I_{C16}$ is reverse in phase from that of the collector currents $I_{C14}$ and $I_{C17}$.

Since the sum current of the collector currents $I_{C15}$ and $I_{C16}$ is the collector current $I_{C21}$ of the transistor $Q_{21}$ and this transistor $Q_{21}$ together with the transistor $Q_{22}$ form the current mirror circuit 21, the collector current $I_{C22}$ of the transistor $Q_{22}$ becomes as shown in FIG. 5G. If the collector currents of the transistors $Q_{25}$, $Q_{27}$, $Q_{31}$ and $Q_{32}$ are taken as $I_{C25}$, $I_{C27}$, $I_{C31}$ and $I_{C32}$, the following relation is established.

$$\left.\begin{array}{r} I_{C14} + I_{C17} = I_{C25} \\ = I_{C27} \end{array}\right\} \text{current mirror circuit 22}$$

$$\left.\begin{array}{r} = I_{C31} \\ = I_{C32} \end{array}\right\} \text{current mirror circuit 23}$$

Thus, the collector current $I_{C32}$ of the transistor $Q_{32}$ becomes as shown in FIG. 5J.

In this case, as the collector current $I_{C22}$ (refer to FIG. 5G) is increasing, the collector current $I_{C32}$ (refer to FIG. 5J) is decreasing, while as the collector current $I_{C22}$ is decreasing, the collector current $I_{C32}$ is increasing. Therefore, the subtraction or difference current of the collector currents $I_{C22}$ and $I_{C32}$ flows through the resistor $R_7$ from the voltage source $v_2$. That is, through the resistor $R_7$ there flows the subtraction current of the collector currents $I_{C22}$ and $I_{C32}$ as shown in FIG. 5K. As a result, across the resistor $R_7$ there is produced by this subtraction current an alternating voltage $E_1$ whose frequency is twice that of the intermediate frequency $f_i$ and whose duty ratio is 50% when the intermediate frequency $f_i$ is the center frequency 10.7MHz and is varied in proportion to a deviation amount of the intermediate frequency $f_i$ from the center frequency 10.7MHz when the former deviates from the latter.

Further, in this case when the DC components of the collector currents $I_{C22}$ and $I_{C32}$ are taken in account, these DC components are equal with each other. Therefore, the DC components do not flow through the resistor $R_7$ and, hence the DC potential at the output terminal $T_1$ becomes the voltage $V_2$ of the voltage source $V_2$. That is, the AC voltage $E_1$ whose DC level is $V_2$, is obtained at the output terminal $T_1$.

Similarly, at the output terminal $T_2$ there is obtained an alternating voltage $E_2$ whose DC level is $V_2$. In this case, however, the alternating voltage $E_2$ has the frequency twice that of the intermediate frequency $f_i$ and its duty ratio becomes 50% when the intermediate frequency $f_i$ is the center frequency 10.7MHz and is changed in a direction opposite to that of the alternating voltage $E_1$ when the intermediate frequency $f_i$ is deviated. That is, as shown in FIG. 6, the transistors $Q_{22}$ and $Q_{32}$ operate as a constant current signal source $X_1$ and $Q_{26}$ and $Q_{34}$ operate as a constant current signal source $X_2$. At this time, an output current from the constant current signal source $X_1$ becomes ($I_{C22} - I_{C32}$) and that from the constant current signal source $X_2$ becomes ($I_{C26} - I_{C34}$) where $I_{C26}$ and $I_{C34}$ represent the collector currents of the transistors $Q_{26}$ and $Q_{34}$, respectively. Further, the resistors $R_7$ and $R_8$ become connected to the constant current signal sources $X_1$ and $X_2$, respectively, and the alternating voltages $E_1$ and $E_2$ are obtained at the output terminals $T_1$ and $T_2$, respectively.

Accordingly, if the alternating voltage $E_1$ obtained at the terminal $T_1$ is supplied to a low pass filter $L_1$ for eliminating double frequency intermediate frequency components and alternating components (AC components except super low frequency components), such a signal whose DC level is $V_2$ and increases in accordance with an increase of the intermediate frequency $f_i$ as shown in the graph of FIG. 7 by a broken line or an AFC voltage signal $S_1$ is obtained. Further, if the alternating voltage $E_2$ obtained at the terminal $T_2$ is supplied to a low pass filter $L_2$, there is obtained an AFC voltage signal $S_2$ whose DC level is $V_2$ and changed reversely as that of the AFC voltage signal $S_1$ as shown in the graph of FIG. 7 by a solid line.

The muting operation of the example shown in FIG. 4 is carried out as follows. That is, the sum current of the collector currents $I_{C15}$ and $I_{C16}$ of the transistors $Q_{15}$ and $Q_{16}$ is equal to the collector current $I_{C42}$ of the transistor $Q_{42}$ due to the operational theory of the current mirror circuits 21, 25 and 27, and the sum current of the collector currents $I_{C14}$ and $I_{C17}$ of the transistors $Q_{14}$ and $Q_{17}$ is equal to the collector current $I_{C38}$ of the transistor $Q_{38}$ due to the operational theory of the current mirror circuits 22 and 26, respectivey. In this case, since the increase and decrease of the collector current $I_{C42}$ is reverse in phase to that of the collector current $I_{C38}$, across the resistor $R_9$ there is produced an alternating voltage $E_3$ shown in FIG. 5K by the difference or subtraction current of the collector currents $I_{C38}$ and $I_{C42}$. This alternating voltage $E_3$ is derived from the terminal $T_3$. Therefore, if this alternating voltage $E_3$ is supplied to a low pass filter $L_3$ for eliminating double frequency intermediate frequency components, a discriminated signal $S_3$ shown in the graph of FIG. 7 by the broken line can be obtained.

At this time, if a muting signal is fed to the terminal $T_4$, the transistor $Q_{43}$ becomes ON and, accordingly, the transistors $Q_{36}$ and $Q_{38}$ are made OFF, respectively. As a result, no discriminated signal $S_3$ is obtained from the low pass filter $L_3$, that is, the muting operation is carried out.

Further, the double frequency intermediate frequency components contained in the alternating voltages $E_1$ and $E_2$ obtained at the terminals $T_1$ and $T_2$ can be eliminated by the circuit shown in FIG. 8, in which the reference numerals and symbols which are the same as FIG. 4 represent the same elements. Reference numeral 40 generally designates the transistor circuit shown in FIG. 4. As shown in FIG. 8, between the terminals $T_1$ and $T_2$ there is connected to a capacitor $C_{11}$ through which the double frequency intermediate frequency components in the alternating voltages $E_1$ and $E_2$ are cancelled with each other. Accordingly, at one terminal of the capacitor $C_{11}$ there is obtained a signal where the DC level is $V_2$ and is increased as the intermediate frequency $f_i$ increases or discriminated signal $E_{11}$ shown in the graph of FIG. 7 by the broken line. While, at the other terminal of the capacitor $C_{11}$ there is obtained a discriminated signal $E_{12}$ whose DC level is $V_2$ and is reverse in phase to the signal $E_{11}$ shown in the graph of FIG. 7 by the solid line.

The discriminated signals $E_{11}$ and $E_{12}$ reverse in phase to each other are supplied through resistors $R_{11}$ and $R_{12}$ to a capacitor $C_{12}$ connected therebetween. In this case, the resistors $R_{11}$, $R_{12}$ and the capacitor $C_{12}$ form a low pass filter, so that AC components (except for super low frequency components) in the signals $E_{11}$ and $E_{12}$ are cancelled with each other. Thus, at both terminals of the capacitors $C_{12}$ there are obtained the AFC voltage signals $S_1$ and $S_2$ whose DC levels are $V_2$ and are changed reversely with each other when the intermediate frequency $f_i$ is varied, as shown in the graph of FIG. 7. These AFC voltage signals $S_1$ and $S_2$ are delivered to terminals $T_{11}$ and $T_{12}$ led out from both terminals of the capacitor $C_{12}$, respectively. The AFC voltage signal $S_1$ delivered to the terminal $T_{11}$ is supplied to a variable capacitance diode $Da$ of a local oscillator circuit 5 to perform an AFC operation. In the block 5, $Ca$ and $La$ designate a variable capacitor and a coil which form the local oscillator circuit 5 together with the diode $Da$.

In the circuit shown in FIG. 8, between the terminals $T_{11}$ and $T_{12}$ there is provided a switch $S_{11}$ for controlling the AFC operation. If the switch $S_{11}$ is made ON or closed, the AFC voltage signals $S_1$ and $S_2$ are cancelled with each other. As a result, the AFC voltages $S_1$ and $S_2$ become DC voltages whose levels are $V_2$ irrespective of the intermediate frequency $f_i$.

As described above, the AFC voltages $S_1$ and $S_2$ which are the reverse of one another are obtained by this invention. In this case, according to the invention the AFC voltages $S_1$ and $S_2$ have a DC level of $V_2$, so that in order to perform an AFC operation with the AFC voltage $S_1$ or $S_2$ it is sufficient to only supply either one of the AFC voltage $S_1$ and $S_2$ to the variable capacitance diode $Da$ as shown in FIG. 8, and there is no need to provide a constant voltage diode for reverse biasing.

Further, with the invention two AFC voltages $S_1$ and $S_2$ are obtained which are the reverse of each other, so that it is sufficient to change the connection of the terminals $T_{11}$ and $T_{12}$ to the oscillator circuit 5 as shown in FIG. 8 by solid and broken lines for lower heterodyne and upper heterodyne operation, respectively. In this case, since the front end where the local oscillator circuit 5 is provided and the descriminator are generally assembled on separate printed circuit boards, it is simple to change the connection therebetween because the connection change is carried out between the printed circuit board of the front end and that of the discriminator. Further, there is no need to provide separate printed circuit boards of the discriminator for the lower heterodyne and the upper heterodyne, respectively, so that this invention is very suitable for mass-production.

Since the DC level of the AFC voltages $S_1$ and $S_2$ is constant as $V_2$ regardless of whether the AFC switch $S_{11}$ is ON or OFF, upon tuning a phenomenon whereby the tuning abruptly occurs or the detuning suddenly occurs is avoided and, hence the tuning can be performed smoothly.

Further, as shown in FIG. 8, the switching circuit 40 can be made as an integrated circuit except the phase shifting circuit 30, which is easy to construct.

FIG. 9 shows another example of the invention in which an FET $Q_{44}$ is employed in place of the switch $S_{11}$ used in the example of FIG. 8. In the example of FIG. 9, a depression type MOS-FET $Q_{44}$ is employed whose drain-source path is connected in parallel to the capacitor $C_{12}$, and whose gate is connected through a resistor $R_{13}$ to the voltage source of $+V_{CC}$ and also grounded through an AFC switch $S_{12}$.

With the example shown in FIG. 9, when the AFC switch $S_{12}$ is ON, the FET $Q_{44}$ is made OFF by the DC level $V_2$ of the AFC voltages $S_1$ and $S_2$ to carry out the AFC operation, while when the AFC switch $S_{12}$ is OFF, the FET $Q_{44}$ is made ON by the voltage from the voltage source of $+V_{CC}$ to prevent the AFC operation.

In the case where the FET $Q_{44}$ is employed as shown in FIG. 9, the AFC switch $S_{12}$ is not floated and can be grounded. In addition, the connection of the AFC switch $S_{12}$ proposes no problem. Further, it is possible to select the pinch-off voltage of the FET $Q_{44}$ as 2 to 3 volts and the voltage $V_2$ as 5 to 6 volts, by way of example, so that the FET $Q_{44}$ can be made ON and OFF positively by the circuit construction shown in the figure.

In the above examples, in place of the capacitor $C_{11}$ it is possible to use a series resonance circuit for eliminating double frequency intermediate frequency components.

In the examples of FIGS. 8 and 9, 3 designates a stereo discriminator circuit which can be connected through a capacitor to the terminal $T_2$ as shown by the dotted lines in FIGS. 8 and 9. In this case, the discriminated output is same as the signal $S_2$ shown by the solid line in FIG. 7.

In the example of FIG. 9, a series connection of a capacitory $C_{22}$ and the FET $Q_{51}$ is connected in parallel to the capacitor $C_{11}$. The gate of the FET $Q_{51}$ is connected to a muting signal producing circuit 50. Thus, when the FET $Q_{51}$ is made ON by the signal from the muting signal producing circuit 51, the signals $E_{11}$ and $E_{12}$ will cancel each other because they are reverse in phase. As a result, no signal is supplied to the stereo discriminator circuit 3 and hence the so-called muting operation is achieved. In this case, a resister $R_{51}$ is connected to make the potentials at the drain and source of the FET $Q_{51}$ equal.

It will be apparent that many modifications and variations could be effected by those skilled in the art without departing from the spirit or scope of the novel concepts of the present invention.

I claim as my invention:
1. An FM discriminator having circuit means providing at least two differential switching circuits supplied with a frequency modulated signal and an additional signal which has a predetermined phase difference with respect to said frequency modulated signal, said circuit means producing first and second output signals in opposite phase relationship with each other in response to the phase difference between said frequency modulated and additional signals, and including:
  a. a first constant current signal course for producing a first constant current alternating signal which is varied in its duty ratio in response to the frequency of said first and second output signals;
  b. a second constant current signal source for producing a second constant current alternating signal which is opposite in polarity with respect to said first constant current alternating signal; and
  c. biasing means for applying a biasing voltage to said first and second constant current signal sources through resistor means, to maintain a predetermined DC level on said first and second constant current alternating signals.

2. An FM discriminator as claimed in claim 1, wherein said first constant current signal source includes a transistor supplied with said first output signal and a transistor supplied with said second output signal, whereby said first constant current alternating signal is provided by subtracting said second output signal from said first output signal, and said second constant current signal source includes a transistor supplied with said second output signal and a transistor supplied with said first output signal, whereby said second constant current alternating signal is provided by subtracting said first output signal from said second output signal.

3. An FM discriminator as claimed in claim 1, wherein said first constant current signal source includes a first transistor whose base and collector electrodes are connected together, a second transistor whose base electrode is connected to the base electrode of said first transistor and whose emitter electrode is connected to a potential point common to the emitter electrode of said first transistor, and a third transistor connected to said second transistor, said first transistor being supplied with said first output signal, said third transistor being supplied with said second output signal, the connection point between said second and third transistors being connected to said biasing means through said resistor means and to a first output circuit, and said second constant current signal source includes a fourth transistor whose base and collector electrodes are connected together, a fifth transistor whose base electrode is connected to the base electrode of said fourth transistor and whose emitter electrode is connected to a potential point common to the emitter electrode of said fourth transistor and a sixth transistor connected to said fifth transistor, said fourth transistor being supplied with said second signal, said sixth transistor being supplied with said first output signal, the connection point between said fourth and fifth transistors being connected to said biasing means through said resistor means and to a second output circuit.

4. An FM discriminator as claimed in claim 3, wherein said third transistor is connected at its base electrode to the base electrode of a seventh transistor whose collector and base electrodes are connected together, the emitter electrodes of said third and seventh transistors are connected to a common potential point, said seventh transistor being supplied with said second output signal through said second constant current signal source, the base electrode of said sixth transistor is connected to the base electrode of an eighth transistor whose collector and emitter electrodes are connected together, and the emitter electrodes of said sixth and eighth transistors are connected to a common potential point, said eighth transistor being supplied with said first output signal through said first constant current signal source.

5. An FM discriminator according to claim 1, further including a third constant current signal source producing a third constant current alternating signal which is same in phase with said first or second constant current alternating signal, a second resistor setting the DC level of said third constant current alternating signal at a predetermined biasing voltage, and switching means for making said third constant current alternating signal ON and OFF.

6. An FM discriminator as claimed in claim 5, wherein said third constant current signal source includes a first transistor whose base and collector electrodes are connected together, a second transistor whose base electrode is connected to the base electrode of said first transistor and whose emitter electrode is connected to a potential point common to the emitter electrode of said first transistor and a third transistor connected to said first transistor, said third transistor being supplied with one of said output signals, and said second transistor is connected with circuit means for deriving an audio signal.

7. An FM descriminator according to claim 1 further including a series circuit consisting of a third resistor, a first capacitor and a fourth resistor and connected between said first and second constant current signal sources, switching means connected across said first capacitor, said first and second constant current alternating signals being applied to both ends of said series circuit, and means for deriving an AFC signal from at least one of both ends of said switching means.

8. An FM discriminator as claimed in claim 7, wherein said switching means is formed of an FET whose drain and source path is connected between said third and fourth resistors and whose gate electrode is supplied with a control voltage.

9. An FM discriminator according to claim 7 further includng a second capacitor connected in parallel to said series circuit, an audio signal being derived from one end of said second capacitor.

10. An FM discriminator having circuit means supplied with an intermediate frequency FM signal and an additional signal which has a predetermined phase difference at an intermediate frequency with respect to said FM signal, said circuit means producing opposite phase first and second output signals in response to the phase difference between said FM and additional signals, and including:
  a. first circuit means for producing a first constant current alternating signal having a duty ratio which varies in response to the frequency of said first and second output signals connected to said first circuit means;
  b. a second circuit means for producing a second constant current alternating signal which is of opposite polarity with respect to said first constant current alternating signal, said second circuit means being connected to said first and second output signals; and
  c. low pass filter means connected to said first and second constant current alternating signals for producing first and second automatic frequency control signals having opposite amplitude changes with respect to frequency deviations between said FM signal and said intermediate frequency.

* * * * *